(12) United States Patent
Park

(10) Patent No.: US 6,841,471 B2
(45) Date of Patent: Jan. 11, 2005

(54) FABRICATION METHOD OF SEMICONDUCTOR DEVICE

(75) Inventor: Geon-Ook Park, Seoul (KR)

(73) Assignee: Anam Semiconductor, Inc., Seoul (KR)

(*) Notice: Subject to any disclaimer, the term of this patent is extended or adjusted under 35 U.S.C. 154(b) by 0 days.

(21) Appl. No.: 10/676,147

(22) Filed: Oct. 2, 2003

(65) Prior Publication Data

US 2004/0067637 A1 Apr. 8, 2004

(30) Foreign Application Priority Data

Oct. 2, 2002 (KR) .................... 10-2002-0060306

(51) Int. Cl.$^7$ ......................................... H01L 21/4763
(52) U.S. Cl. ................... 438/638; 438/629; 438/672; 438/675; 438/738
(58) Field of Search ................... 438/625, 629, 438/637, 638, 640, 643, 666, 668, 672, 675, 735–738, 740

(56) References Cited

U.S. PATENT DOCUMENTS

| | | |
|---|---|---|
| 6,265,319 B1 | 7/2001 | Jang |
| 6,340,435 B1 | 1/2002 | Bjorkman et al. |
| 6,424,044 B1 | 7/2002 | Han et al. |
| 6,440,838 B1 | 8/2002 | Lui et al. |
| 6,451,688 B1 * | 9/2002 | Shimpuku .................... 438/638 |
| 6,475,905 B1 * | 11/2002 | Subramanian et al. ...... 438/637 |
| 6,514,852 B2 * | 2/2003 | Usami ......................... 438/638 |
| 6,562,725 B2 | 5/2003 | Tsai et al. |
| 6,627,540 B2 * | 9/2003 | Lee ............................. 438/638 |
| 6,703,324 B2 * | 3/2004 | Wong .......................... 438/624 |

* cited by examiner

*Primary Examiner*—Kevin M. Picardat
(74) *Attorney, Agent, or Firm*—Pillsbury Winthrop LLP

(57) ABSTRACT

A fabrication method of a semiconductor device includes forming an interlayer dielectric film over an entire surface of a semiconductor substrate that includes a lower line. A barrier layer having an etching rate that is lower than an etching rate of the interlayer dielectric film is formed on the interlayer dielectric film. The barrier layer is selectively etched to expose a predetermined region of the interlayer dielectric film. Next, a photoresist pattern is formed on the barrier layer having an opening of a predetermined area corresponding to the exposed region of the interlayer dielectric film. The opening of the photoresist pattern has an area that is greater than an area of the exposed region of the interlayer dielectric film. The line opening and the via are then simultaneously formed by etching the exposed regions of the barrier layer and the interlayer dielectric film. Finally, a metal plug is formed by filling the line opening and the via with a metal material.

15 Claims, 4 Drawing Sheets

FABRICATION METHOD OF SEMICONDUCTOR DEVICE

BACKGROUND OF THE INVENTION (a) Field of the Invention

The present invention relates to a fabrication method of a semiconductor device, and more particularly, to a method of fabricating a copper line in a semiconductor device.

(b) Description of the Related Art

Tungsten (W), aluminum (Al), or an aluminum alloy are typically used as the metal to form a metal line in a semiconductor device. However, much research is being performed on ways to use copper (Cu) in place of tungsten and aluminum for the metal wiring in semiconductor devices because of the relatively low resistivity of copper and because copper provides for a high degree of reliability when used for such an application (i.e., the metal wiring in a semiconductor device).

Nevertheless, a drawback of copper is that, unlike with tungsten and aluminum, it is difficult to form lines in semiconductor devices by reactive ion etching. Accordingly, much research is being performed on ways to simultaneously form a plug and a line without the use of reactive ion etching. Such a process is referred to as a dual damascene process.

In the conventional dual damascene process in which copper is used, copper is blanket-deposited on a wafer, then unnecessary parts of the copper layer on a surface of the wafer are removed by chemical-mechanical polishing to thereby complete the formation of a copper plug and a metal line.

A conventional method for fabricating a semiconductor device will be described below with reference to FIGS. 1a through 1e.

Referring first to FIG. 1a, a lower insulation layer 2 and a lower metal line 3 are formed on a semiconductor substrate 1. Next, a first SiC layer 4 for use as an etching completion layer during etching to form a via is formed over the lower insulation layer 2 and the lower metal line 3.

Following the formation of the first SiC layer 4, a first SiOC layer 5 is formed on the SiC layer 4. The SiOC layer 5 acts as an interlayer dielectric film. Formed over the first SiOC layer 5 is a second SiC layer 4', which acts as an etching completion layer during etching to form a line opening. A second SiOC layer 5' is formed over the second SiC layer 4'. The second SiOC layer 5' acts as an interlayer dielectric film.

Next, with reference to FIG. 1b, a photosensitive layer is deposited on the second SiOC layer 5', after which the photosensitive layer is exposed and developed to form a first photoresist pattern (not shown) for forming a line opening. Using the first photoresist pattern as a mask and the second SiC layer 4' as an etching completion layer, the second SiOC layer 5' and the second SiC layer 4' are etched at a predetermined area to thereby form a line opening 100. The first photoresist pattern is then removed, after which a cleaning process is performed.

Subsequently, with reference to FIG. 1c, a second photoresist pattern (not shown) is formed on the second SiOC layer 5'. The second photoresist pattern has an opening centered about the line opening 100 and a width that is less than a width of an opening of the first photoresist pattern, that is, less than a width of the line opening 100. Using the second photoresist pattern as a mask and the first SiC layer 4 as an etching completion layer, the exposed first SiOC layer 5 and the first SiC layer 4 are etched until the lower metal line 3 is exposed to thereby form a via 200.

Next, with reference to FIG. 1d, a barrier metal layer 6 made of TaN is deposited to a thickness of approximately 300 Å over all exposed surfaces of the lower metal line 3, the first SiOC layer 5, and the second SiOC layer 5'. Next, a copper layer 7 is deposited on the barrier metal layer 6 until the via 200 and the line opening 100 are completely filled.

Referring to FIG. 1e, chemical-mechanical polishing is performed on the copper layer 7 until the second SiOC layer 5' is exposed and the copper layer 7 is substantially flush with the same. As a result, the via 200 and the copper line layer are simultaneously formed.

However, in the configuration resulting from the conventional method described above, since the SiC layer 4', which is used as an etching completion layer, is interposed between the SiOC layers 5 and 5', which are interlayer insulating layers, the overall capacitance of the device is increased significantly when compared to when no SiC layer is formed between the SiOC layers 5 and 5'. This interferes with the free flow of current such that the operational speed of the device is reduced.

Further, with the direct contact of the photosensitive layers to surfaces and side walls of the SiOC layers for the formation of the line opening and the via, full removal of the photosensitive layers does not occur. This results in increasing the resistances of the via and the lie opening.

SUMMARY OF THE INVENTION

In one exemplary embodiment of the present invention, there is provided a fabrication method of a semiconductor device in which overall capacitance is reduced and the problem of residual photosensitive material is overcome by avoiding a structure where an SiC layer is interposed between SiOC layers in a dual damascene process utilizing copper.

In an exemplary embodiment of the present invention, a fabrication method of a semiconductor device includes forming an interlayer dielectric film over an entire surface of a semiconductor substrate that includes a lower line formed on a structure of the semiconductor substrate. Also formed on the interlayer dielectric film is a barrier layer having an etching rate that is lower than an etching rate of the interlayer dielectric film. The barrier layer is selectively etched to expose a predetermined region of the interlayer dielectric film corresponding to where a via is to be formed. Next, a photoresist pattern is formed on the barrier layer having an opening of a predetermined area corresponding to the exposed region of the interlayer dielectric film and to where a line opening is to be formed. The opening of the photoresist pattern has an area that is greater than an area of the exposed region of the interlayer dielectric film such that a region of the barrier layer adjacent to the exposed region of the interlayer dielectric film is exposed. The line opening and the via are then simultaneously formed by etching the exposed regions of the barrier layer and the interlayer dielectric film using the photosensitive film pattern as a mask. Finally, a metal plug is formed by filling the line opening and the via with a metal material.

For the simultaneous formation of the line opening and the via, during etching the exposed regions of the interlayer dielectric film to form the via, the exposed region of the barrier layer above the region where the line opening is to be formed is etched, then the interlayer dielectric film is etched to form the line opening to a depth less than a depth of the via.

Copper may be used as the metal material. Also, for the formation of a metal plug, copper is deposited on the barrier layer and into the line opening and the via until filling the same, then chemical-mechanical polishing of the copper is performed until the interlayer dielectric film is exposed.

Silicon carbide (SiC) is formed to a thickness of between 100 and 500 Å to form the barrier layer.

In addition, prior to forming the interlayer dielectric film, a lower barrier layer is formed of a material having a lower etching rate than the interlayer dielectric film over all exposed elements including the lower line.

Silicon carbide (SiC) is formed to a thickness between 100 and 500 Å to form the lower barrier layer.

For the simultaneous formation of the line opening and the via, the lower barrier layer is etched following etching of the exposed interlayer dielectric film to thereby form the via.

Over-etching by 5–15% may be performed following the further etching the lower barrier layer to remove a predetermined region of the lower barrier layer.

Silicon oxy-carbide (SiOC) is formed to a thickness of between 10,000 and 14,000 Å to form the interlayer dielectric film.

Prior to forming the copper plug, a barrier metal layer is formed along inner walls of the line opening and the via, and on the barrier layer. The barrier metal layer may be made of Ti, Ta, or TaN. Further, the barrier metal layer is formed to a thickness of 100~500 Å.

During formation of the copper plug, a first formation process is performed in which plasma chemical vapor deposition is used to deposit copper to a thickness of 500~1500 Å, after which a second formation process is performed in which electrodeposition is used to deposit copper on the copper deposited in the first formation process and such that the via and the line opening are filled with copper.

The lower line may be made of copper or tungsten.

BRIEF DESCRIPTION OF THE DRAWINGS

The accompanying drawings, which together with the specification, illustrate an exemplary embodiment of the present invention, and, together with the description, serve to explain the principles of the present invention.

DETAILED DESCRIPTION

An exemplary embodiment of the present invention will now be described in detail with reference to the accompanying drawings.

FIGS. 2a through 2e are partial sectional views used to describe a fabrication method of a semiconductor device according to an exemplary embodiment of the present invention.

Figure 1A:
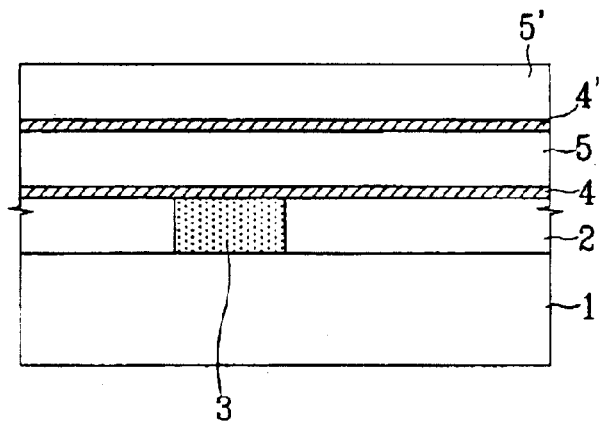
FIGS. 1a through 1e are partial sectional views used to describe a conventional fabrication method of a semiconductor device.
Figure 1B:
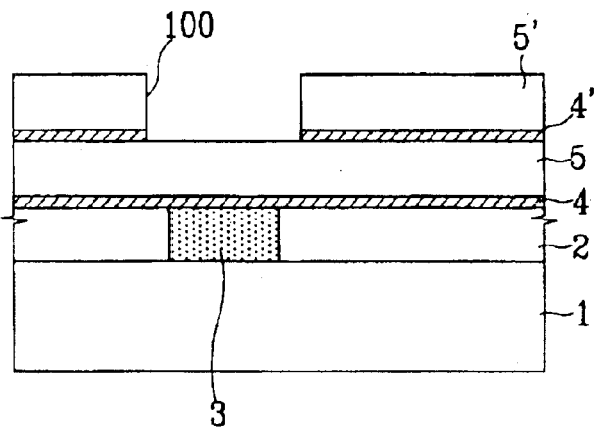
Figure 1C:
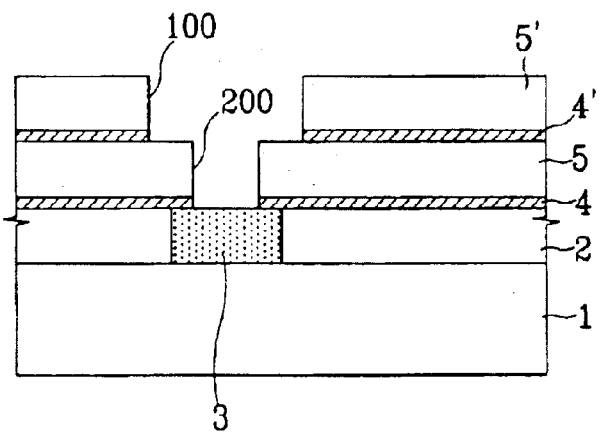
Figure 1D:
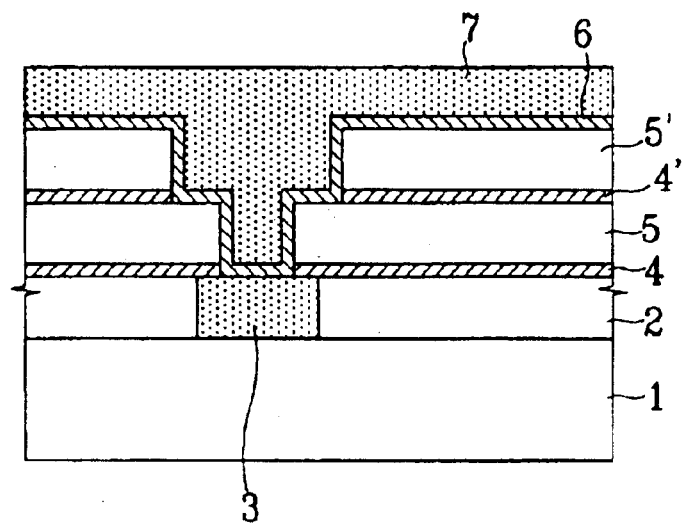
Figure 1E:
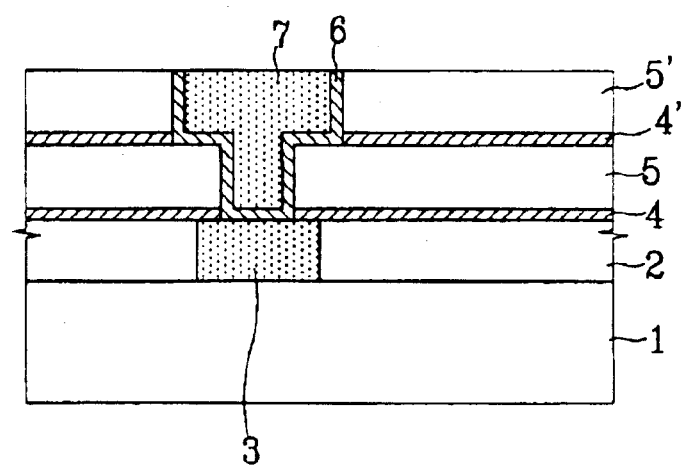
Figure 2A:
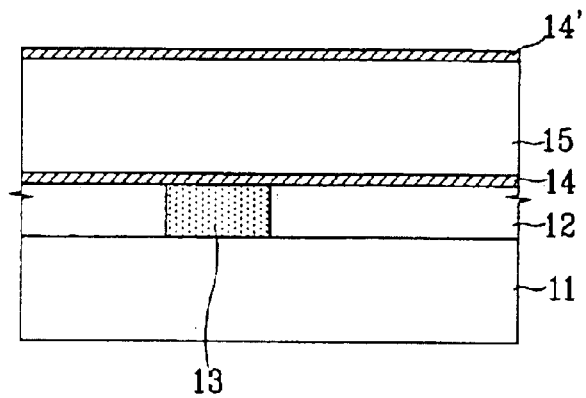
FIGS. 2a through 2e are partial sectional views used to describe a fabrication method of a semiconductor device according to an exemplary embodiment of the present invention.

Referring first to FIG. 2a, a lower insulation layer 12 made of an oxide film is formed on a structure 11 of a semiconductor substrate, that is, on a semiconductor substrate on which individual devices are formed or on a lower metal line layer. The lower insulation layer 12 is selectively etched to form a line opening, after which copper is deposited on the lower insulation layer 12 and within the line opening. Chemical-mechanical polishing is then performed until the lower insulation layer 12 is exposed to thereby form the lower line 13.

The lower line 13 need not necessarily be formed of copper. That is, it is possible to realize this element by forming a metal layer using, for example, tungsten, then patterning the metal layer to form the lower line 13. The lower line 13 realizes a circuit formation of the semiconductor device.

Next, a first barrier layer 14 is formed on the lower insulation layer 12 and on the lower line 13. The first barrier layer 14 is made of a material having a low dielectric constant and is used as an etching completion layer during etching to form a via. An interlayer dielectric film 15 is thickly deposited on the first barrier layer 14, then a second barrier layer 14' is formed on the interlayer dielectric film 15. The second barrier layer 14' is made of a material having a low dielectric constant. It is to be noted that the formation of the first barrier layer 14 is optional and can be omitted from the structure without experiencing any particular problems in the final device.

The first and second barrier layers 14 and 14' may each be formed of silicon carbide (SiC) and at a thickness between 100 and 500 Å, preferably 300 Å. Further, for the interlayer dielectric film 15, silicon oxy-carbide (SiOC), which has a low dielectric constant, may be formed to a thickness of between 10,000 and 14,000 Å, preferably 12,000 Å.

By using a material having a low dielectric constant for the interlayer dielectric film 15, a capacitance between copper line layers is low such that the flow of current is only minimally hindered. As a result, fast signal transmission is realized to thereby increase the operational speed of the device.

Figure 2B:
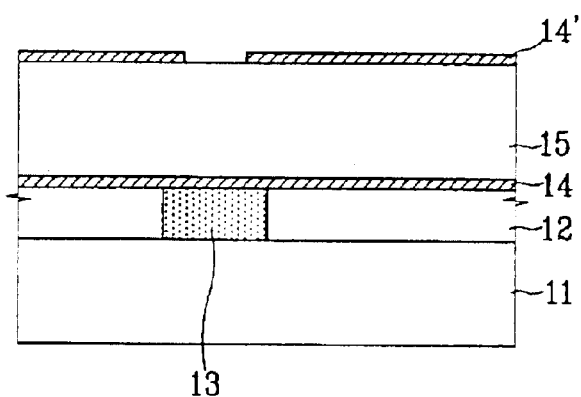

Subsequently, with reference to FIG. 2b, a photosensitive layer is deposited on the second barrier layer 14', then the photosensitive layer is exposed and developed to thereby form a first photoresist pattern (not shown) that exposes a region of the second barrier layer 14' corresponding to above where a via will be formed. The first photoresist pattern is then used as a mask to etch the second barrier layer 14' and expose a predetermined area of the interlayer dielectric film 15. The first photoresist pattern is removed after this process, then a cleaning process is performed.

Figure 2C:
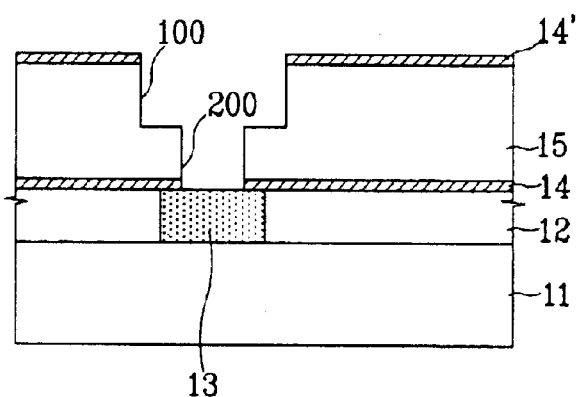

Next, with reference to FIG. 2c, a photosensitive layer is deposited, then exposed and developed to form a second photoresist pattern (not shown) that exposes a region of the second barrier layer 14' corresponding to above where a line opening will be formed. It is preferable that an opening width of the second photoresist pattern is greater than an opening width of the first photoresist pattern, and that the opening of the second photoresist pattern is centered about the opening of the first photoresist pattern, that is, about the predetermined exposed area of the interlayer dielectric film 15.

Using the second photosensitive pattern as a mask, exposed portions of the second barrier layer 14' and the interlayer dielectric film 15 are etched. Etching is performed for a predetermined time that is determined by the inherent etching rate of SiC, from which the second barrier layer 14' is made, and of SiOC, from which the interlayer dielectric film 15 is made. As a result of this process, a line opening 100 and a via 200 are simultaneously formed. The second photoresist pattern is then removed and a cleaning process is performed.

In the above etching process to form the line opening 100 and the via 200, since the etching rate of SiC is less than that of SiOC, the interlayer insulating layer 15 that exposes the area where the via 200 is to be formed is quickly etched to thereby form the via 200, while the second barrier layer 14' that exposes the area where the line opening 100 is to be formed is slowly etched. After the second barrier layer 14' is removed by the etching process, the interlayer insulating layer 15 under this area is etched. By selecting an appropriate etching time, the line opening 100 and the via 200 may be formed through a single process.

Further, by increasing the etching time determined by the etching rates of SiC and SiOC and sufficient to form the line opening 100 and via 200 by approximately 10%, the first barrier layer 14 in the area of the via 200 may be etched.

Figure 2D:
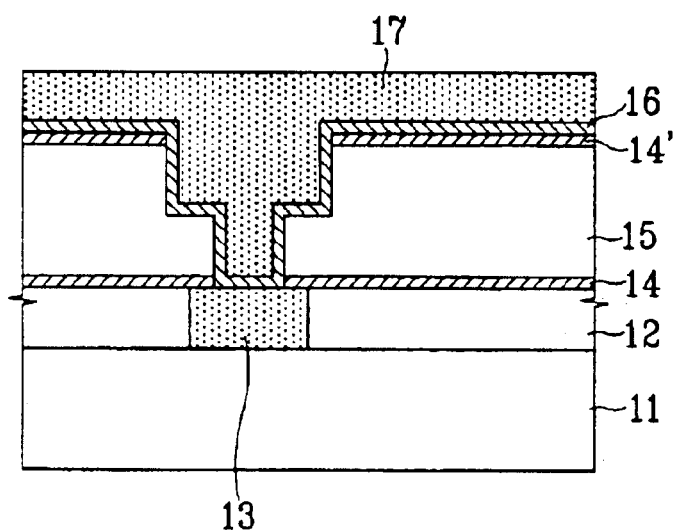

Next, with reference to FIG. 2d, a barrier metal layer 16 is thinly deposited over all exposed elements including an area of the lower line 13 exposed through the via 200. Copper 17 is then deposited on the barrier metal layer 16 until filling the via 200 and the line opening 100.

The barrier metal layer 16 prevents the copper 17 from permeating the interlayer dielectric film 15. Also, the barrier metal layer 16 is made of Ti, Ta, or TaN and to a thickness of 100~500 Å. Preferably, the barrier metal layer 16 is made of TaN and to a thickness of 300 Å.

When depositing the copper 17, a seed layer is first deposited to a thickness of 500~1500 Å using plasma chemical vapor deposition, then the copper 17 is formed to a thickness of approximately 3500 Å using electroplating such that the via 200 and the line opening 100 are fully filled.

Figure 2E:
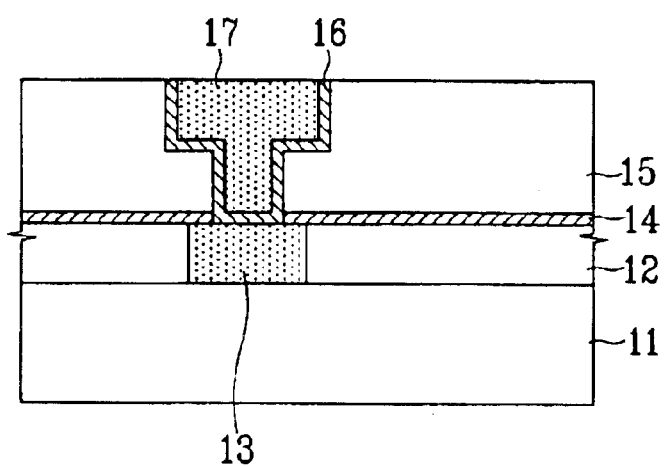

As a final step, with reference to FIG. 2e, chemical-mechanical polishing is performed on the copper 17 until the interlayer dielectric film 15 is exposed. That is, chemical-mechanical polishing is performed until the copper 17 is flush with the interlayer dielectric film 15 to thereby form a copper plug.

It is to be noted that the present invention applies also when the plug is made of a metal other than copper, that is, the present invention is not limited to the use of copper for the plug.

In the present invention described above, the SiC layer is positioned on the interlayer dielectric film, and the line opening and via are simultaneously formed by utilizing differences in the etching rates of the SiC layer and the interlayer dielectric film. Therefore, the overall capacitance of the device can be reduced over the conventional configuration in which an SiC layer is interposed between interlayer dielectric films. A reduction in capacitance of the device results in the faster flow of current to thereby improve device performance.

In addition, since the SiOC layer forming the interlayer dielectric film does not directly contact the photosensitive layers, the problems associated with residual photosensitive material are avoided.

Although an embodiment of the present invention has been described in detail hereinabove in connection with a certain exemplary embodiment, it should be understood that the invention is not limited to the disclosed exemplary embodiment, but, on the contrary is intended to cover various modifications and/or equivalent arrangements included within the spirit and scope of the present invention, as defined in the appended claims.

What is claimed is:

1. A fabrication method of a semiconductor device, comprising the steps of:

forming an interlayer dielectric film over an entire structure including a lower metal line formed over a semiconductor substrate;

forming on the interlayer dielectric film a barrier layer having an etching rate that is lower than an etching rate of the interlayer dielectric film, and selectively etching the barrier layer to expose a predetermined region of the interlayer dielectric film corresponding to where a via is to be formed;

forming a photoresist pattern on the barrier layer having an opening of a predetermined area corresponding to the exposed region of the interlayer dielectric film and to where a line opening is to be formed, the opening of the photoresist pattern having an area that is greater than an area of the exposed region of the interlayer dielectric film such that a region of the barrier layer adjacent to the exposed region of the interlayer dielectric film is exposed;

simultaneously forming the line opening and the via by etching the exposed regions of the barrier layer and the interlayer dielectric film dielectric film using the photosensitive film pattern as a mask; and forming a metal plug by filling the line opening and the via with a metal material.

2. The fabrication method of claim 1, wherein the simultaneously forming the line opening and the via comprises, during etching the exposed regions of the interlayer dielectric film to form the via, first etching the exposed region of the barrier layer above the region where the line opening is to be formed then directly etching the interlayer dielectric film to form the line opening to a depth less than a depth of the via.

3. The fabrication method of claim 1, wherein copper is the metal material.

4. The fabrication method of claim 2, wherein the forming a metal plug comprises depositing copper on the barrier layer and into the line opening and the via until filling the same, and performing chemical-mechanical polishing of the copper until the interlayer dielectric film is exposed.

5. The fabrication method of claim 1, wherein silicon carbide (SiC) is formed to a thickness of between 100 and 500 Å to form the barrier layer.

6. The fabrication method of claim 1, wherein, prior to forming the interlayer dielectric film, a lower barrier layer is formed of a material having a lower etching rate than the interlayer dielectric film over all exposed elements including the lower line.

7. The fabrication method of claim 6, wherein silicon carbide (SiC) is formed to a thickness between 100 and 500 Å to form the lower barrier layer.

8. The fabrication method of claim 6, wherein the simultaneously forming the line opening and the via comprises further etching the lower barrier layer following etching the exposed interlayer dielectric film to thereby form the via.

9. The fabrication method of claim 8, wherein over-etching by 5–15% is performed following the further etching the lower barrier layer to remove a predetermined region of the lower barrier layer.

10. The fabrication method of claim 1, wherein silicon oxy-carbide (SiOC) is formed to a thickness of between 10,000 and 14,000 Å to form the interlayer dielectric film.

11. The fabrication method of claim 3, wherein, prior to forming the copper plug, a barrier metal layer is formed along inner walls of the line opening and the via, and on the barrier layer.

12. The fabrication method of claim 11, wherein the barrier metal layer is made of a material selected from the group consisting of Ti, Ta, and TaN.

13. The fabrication method of claim 11, wherein the barrier metal layer is formed to a thickness of 100~500 Å.

14. The fabrication method of claim 3, wherein during formation of the copper plug, a first formation process is performed in which plasma chemical vapor deposition is used to deposit copper to a thickness of 500~1500 Å, after which a second formation process is performed in which electroplating is used to deposit copper on the copper deposited in the first formation process and such that the via and the line opening are filled with copper.

15. The fabrication method of claim 1, wherein the lower line is made of one of copper and tungsten.

* * * * *